US011886240B2

(12) United States Patent
Bie et al.

(10) Patent No.: US 11,886,240 B2
(45) Date of Patent: Jan. 30, 2024

(54) MOBILE TERMINAL WITH A BENDABLE STRUCTURE

(71) Applicant: Huawei Technologies Co., Ltd., Shenzhen (CN)

(72) Inventors: Wentao Bie, Shanghai (CN); Wen Fan, Dongguan (CN); Chia Huan Chang, Shenzhen (CN); Qilin Xu, Shanghai (CN); Rui Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 365 days.

(21) Appl. No.: 17/260,907

(22) PCT Filed: Jul. 17, 2018

(86) PCT No.: PCT/CN2018/095964
§ 371 (c)(1),
(2) Date: Jan. 15, 2021

(87) PCT Pub. No.: WO2020/014865
PCT Pub. Date: Jan. 23, 2020

(65) Prior Publication Data
US 2021/0263558 A1    Aug. 26, 2021

(51) Int. Cl.
*G06F 1/16*    (2006.01)
*H05K 1/14*    (2006.01)
*H05K 1/02*    (2006.01)

(52) U.S. Cl.
CPC .......... *G06F 1/1618* (2013.01); *G06F 1/1652* (2013.01); *H05K 1/0281* (2013.01); *H05K 1/147* (2013.01)

(58) Field of Classification Search
CPC ..... G06F 1/1616; G06F 1/1683; H05K 1/028; H05K 1/0281; H05K 1/147; H05K 2201/2009
See application file for complete search history.

(56) References Cited

U.S. PATENT DOCUMENTS

| 4,756,940 A * | 7/1988 | Payne .................... H05K 1/118 428/209 |
| 5,434,362 A | 7/1995 | Klosowiak et al. |
| 6,417,027 B1 | 7/2002 | Akram |
| 9,658,648 B2 * | 5/2017 | Rappoport ............ G06F 1/1656 |
| 10,681,194 B2 * | 6/2020 | Lee ..................... H04M 1/0268 |

(Continued)

FOREIGN PATENT DOCUMENTS

| CN | 2426261 Y | 4/2001 |
| CN | 201557324 U | 8/2010 |

(Continued)

*Primary Examiner* — James Wu
(74) *Attorney, Agent, or Firm* — Conley Rose, P.C.

(57) ABSTRACT

The mobile terminal includes a first part, a second part, a connection structure, and a flexible circuit board. A signal is transmitted between the first part and the second part through the flexible circuit board. The flexible circuit board includes a first end and a second end. The first end is electrically connected to the first part, and the second end is electrically connected to the second part. The flexible circuit board passes through the connection structure, and a part of the flexible circuit board in the connection structure maintains a regular bending structure.

20 Claims, 7 Drawing Sheets

(56) References Cited

U.S. PATENT DOCUMENTS

| | | |
|---|---|---|
| 2007/0000126 A1 | 1/2007 | Na |
| 2010/0273539 A1 | 10/2010 | Lee et al. |
| 2014/0078692 A1 | 3/2014 | Park et al. |
| 2018/0343330 A1 | 11/2018 | Lin et al. |

FOREIGN PATENT DOCUMENTS

| | | |
|---|---|---|
| CN | 103680319 A | 3/2014 |
| CN | 205196071 U | 4/2016 |
| CN | 105636339 A | 6/2016 |
| CN | 105682356 A | 6/2016 |
| CN | 206726109 U | 12/2017 |
| CN | 207166860 U | 3/2018 |
| KR | 20070004246 A | 1/2007 |
| KR | 20180081119 A | 7/2018 |

\* cited by examiner

MOBILE TERMINAL WITH A BENDABLE STRUCTURE

CROSS-REFERENCE TO RELATED APPLICATIONS

This application is a U.S. National Stage of International Patent Application No. PCT/CN2018/095964 filed on Jul. 17, 2018, which is hereby incorporated by reference in its entirety.

TECHNICAL FIELD

This application relates to the field of communications technologies, and in particular, to a mobile terminal.

BACKGROUND

Currently, a connection structure of a mobile terminal may include a sliding structure or a bendable structure. For example, the sliding structure may be applied to a slide terminal, and the bendable structure is applied to a notebook computer or a foldable terminal. The sliding structure and the bendable structure each include two parts moving relative to each other: a first part 1 and a second part 2, and a signal is transmitted between the two parts through a flexible circuit board. As shown in FIG. 1 and FIG. 2, the first part 1 and the second part 2 may rotate relative to a bendable structure 3, and a flexible circuit board 4 passes through the bendable structure 3 and is connected to the first part 1 and the second part 2.

For example, when the first part 1 and the second part 2 rotate relative to the bendable structure in an arrow direction shown in the figure, the first part 1 and the second part 2 move towards the bendable structure. In this way, a path required by the flexible circuit board 4 is shortened, and consequently a redundant part occurs on the flexible circuit board 4. As shown in FIG. 2, when the first part 1 and the second part 2 are folded, it is difficult to control a shape of the redundant part of the flexible circuit board 4. Consequently, the redundant part may move irregularly in the bendable structure, and uncontrolled stress concentration may be generated. This is very likely to cause damage to the flexible circuit board, and shorten a service life of the flexible circuit board.

SUMMARY

According to a first aspect, an embodiment of the present invention provides a mobile terminal. The mobile terminal includes a first part, a second part, a connection structure, and a flexible circuit board. A signal is transmitted between the first part and the second part through the flexible circuit board. The flexible circuit board includes a first end and a second end, the first end is electrically connected to the first part, and the second end is electrically connected to the second part. The flexible circuit board passes through the connection structure, and a part of the flexible circuit board that is in the connection structure maintains a regular bending structure. The bending structure includes a plurality of bending parts.

It can be learned from the foregoing description that the flexible circuit board is bent into a regular bending structure and placed into the connection structure, so that the part of the flexible circuit board maintains a regular bending structure when the mobile terminal is used, thereby avoiding damage to the flexible circuit board caused by irregular movement, prolonging a service life of the flexible circuit board, and further prolonging a service life of the entire mobile terminal.

In a specific implementation, the connection structure includes a bendable structure or a sliding structure.

In a specific implementation, a first stiffening plate is disposed between adjacent bending parts. The first stiffening plate increases hardness of the flexible circuit board, so that the part of the flexible circuit board better maintains a regular bending structure when the mobile terminal is used, thereby avoiding damage to the flexible circuit board caused by irregular movement, prolonging a service life of the flexible circuit board, and further prolonging a service life of the entire mobile terminal.

In a specific implementation, the first stiffening plate is located on the flexible circuit board or fastened to the mobile terminal.

In a specific implementation, the bending structure includes two bending parts, and the two bending parts form an S-shaped structure. The flexible circuit board is bent into an S-shaped structure, and the first stiffening plate is disposed between adjacent bending parts, so that the part of the flexible circuit board maintains the S-shaped structure when the mobile terminal is used, thereby avoiding damage to the flexible circuit board caused by irregular movement, prolonging a service life of the flexible circuit board, and further prolonging a service life of the entire mobile terminal.

In a specific implementation, a manner in which the first part and the second part move varies with a connection structure. In the bendable structure, the first part and the second part rotate around the bendable structure. A radian of the bending part of the flexible circuit board after the first part and the second part rotate from an initial state is greater than a radian of the bending part in the initial state. The bending structure accommodates a redundant part of the flexible circuit board. In the sliding structure, the first part and the second part slide oppositely from an initial state. After the sliding, a distance between the first part and the second part increases, and a radian of the bending part when the first part and the second part are in the initial state is greater than a radian of the bending part after the sliding. This is because the bending structure in the initial state accommodates a redundant part of the flexible circuit board. After the first part and the second part slide oppositely, the radian of the bending part decreases to release the redundant part of the flexible circuit board, so that the first part and the second part can slide normally. If the first part and the second part slide oppositely to return to the initial state, the radian of the bending part increases to accommodate the redundant part of the flexible circuit board, so that the flexible circuit board maintains a regular bending structure, thereby effectively protecting the flexible circuit board from being damaged.

In a specific implementation, one or more second stiffening plates are disposed between the first end and the bending structure or between the second end and the bending structure, and the second stiffening plate is located on the flexible circuit board. In this way, a part of the flexible circuit board other than the bending structure can keep moving rectilinearly as far as possible, so that the redundant part of the flexible circuit board is more smoothly transferred to the bending structure, thereby avoiding damage to the flexible circuit board caused by irregular movement, prolonging a service life of the flexible circuit board, and further prolonging a service life of the entire mobile terminal.

In a specific implementation, the mobile terminal includes two second stiffening plates, one is disposed between the first end and the bending structure, and the other is disposed between the second end and the bending structure. In such a manner of symmetrically disposing the second stiffening plates, two sides of the flexible circuit board can move smoothly at the same time, and redundant parts of the flexible circuit board are evenly moved to the two bending parts. Therefore, the bending structure of the flexible circuit board is maintained very well.

In a specific implementation, the flexible circuit board, perpendicular to a length direction of the connection structure, passes through the connection structure at a center of the connection structure. In this way, the flexible circuit board located on two sides of the connection structure before and after the bending presents a symmetric structure, so that structures of the two bending parts are symmetric. Therefore, the bending structure of the flexible circuit board can be maintained very well.

In a specific implementation, a length L of the first stiffening plate meets the following: L>H−2R, where H is a height of the connection structure, and R is a maximum bendable radius of the flexible circuit board in the connection structure. In this way, the length of the first stiffening plate is disposed, so that the plurality of bending parts can maintain a regular bending structure in the connection structure without being unfolded.

In a specific implementation, the mobile terminal further includes a middle frame and a fastening part, and the fastening part is located at an end of the flexible circuit board and is fastened to the connection structure. The flexible circuit board is fastened to the connection structure, so that the flexible circuit board can be limited to moving within a fixed range, thereby more stably controlling the flexible circuit board to maintain a regular bending structure, prolonging a service life of the flexible circuit board, and further prolonging a service life of the mobile terminal.

In a specific implementation, the mobile terminal further includes a middle frame and a fastening part, and the fastening part is located at an end of the flexible circuit board and is fastened to the middle frame. The flexible circuit board is fastened to the middle frame, so that the flexible circuit board can be limited to moving within a fixed range, thereby more stably controlling the flexible circuit board to maintain a regular bending structure, prolonging a service life of the flexible circuit board, and further prolonging a service life of the mobile terminal.

In a specific implementation, the middle frame includes a first middle frame and a second middle frame. The fastening part includes a first fastening part and a second fastening part, and the first fastening part and the second fastening part are located on the flexible circuit board. The first fastening part is located between the first end and the bending structure, the second fastening part is located between the second end and the bending structure, the first fastening part is fastened to the first middle frame, and the second fastening part is fastened to the second middle frame.

In such a manner of symmetrically disposing the middle frame and the fastening part, two sides of the flexible circuit board can move evenly in the fixed range, and redundant parts of the flexible circuit board can be smoothly moved to the two bending parts. Therefore, the bending structure of the flexible circuit board is maintained very well.

According to a second aspect, an embodiment of the present invention provides a connection apparatus, applied to a mobile terminal. The mobile terminal includes a first part and a second part. The connection apparatus includes a connection structure and a flexible circuit board. The flexible circuit board includes a first end and a second end. The flexible circuit board passes through the connection structure, and a part of the flexible circuit board in the connection structure maintains a regular bending structure. The bending structure includes a plurality of bending parts. The first end is configured to be electrically connected to the first part of the mobile terminal, and the second end is configured to be electrically connected to the second part of the mobile terminal, so that a signal is transmitted between the first part and the second part through the flexible circuit board.

It can be learned from the foregoing description that the flexible circuit board is bent into a regular bending structure and placed into the connection structure, so that the part of the flexible circuit board maintains a regular bending structure when the connection structure is used, thereby avoiding damage to the flexible circuit board caused by irregular movement, and prolonging a service life of the flexible circuit board.

In a specific implementation, the connection structure includes a bendable structure or a sliding structure.

In a specific implementation, a first stiffening plate is disposed between adjacent bending parts. The first stiffening plate increases hardness of the flexible circuit board, so that the part of the flexible circuit board better maintains a regular bending structure when the mobile terminal is used, thereby avoiding damage to the flexible circuit board caused by irregular movement, prolonging a service life of the flexible circuit board, and further prolonging a service life of the entire mobile terminal.

In a specific implementation, the first stiffening plate is located on the flexible circuit board or located on the connection structure.

In a specific implementation, the bending structure includes two bending parts, and the two bending parts form an S-shaped structure. The flexible circuit board is bent into an S-shaped structure, and the first stiffening plate is disposed between adjacent bending parts, so that the part of the flexible circuit board maintains the S-shaped structure when the connection structure is used, thereby avoiding damage to the flexible circuit board caused by irregular movement, and prolonging a service life of the flexible circuit board.

In a specific implementation, a manner in which the first part and the second part move varies with a connection structure. In the bendable structure, the first part and the second part rotate around the bendable structure. A radian of the bending part of the flexible circuit board after the first part and the second part rotate from an initial state is greater than a radian of the bending part in the initial state. The bending structure accommodates a redundant part of the flexible circuit board. In the sliding structure, the first part and the second part slide oppositely from an initial state. After the sliding, a distance between the first part and the second part increases, and a radian of the bending part when the first part and the second part are in the initial state is greater than a radian of the bending part after the sliding. This is because the bending structure in the initial state accommodates a redundant part of the flexible circuit board. After the first part and the second part slide oppositely, the radian of the bending part decreases to release the redundant part of the flexible circuit board, so that the first part and the second part can slide normally. If the first part and the second part slide oppositely to return to the initial state, the radian of the bending part increases to accommodate the redundant part of the flexible circuit board, so that the flexible circuit board maintains a regular bending structure, thereby effectively protecting the flexible circuit board from being damaged.

In a specific implementation, one or more second stiffening plates are disposed between the first end and the bending structure or between the second end and the bending structure, and the second stiffening plate is located on the flexible circuit board. In this way, a part of the flexible circuit board other than the bending structure can keep moving rectilinearly as far as possible, so that the redundant part of the flexible circuit board is more smoothly transferred to the bending structure, thereby avoiding damage to the flexible circuit board caused by irregular movement, and prolonging a service life of the flexible circuit board.

In a specific implementation, the mobile terminal includes two second stiffening plates, one is disposed between the first end and the bending structure, and the other is disposed between the second end and the bending structure. In such a manner of symmetrically disposing the second stiffening plates, two sides of the flexible circuit board can move smoothly at the same time, and redundant parts of the flexible circuit board are evenly moved to the two bending parts. Therefore, the S-shaped structure of the flexible circuit board is maintained very well.

The first stiffening plate or the second stiffening plate is made of a rigid material. The rigid material is a polyimide film (Polyimide Film, PI), stainless steel, epoxy resin. Mylar, or a protective film.

In a specific implementation, that the flexible circuit board passes through the connection structure is specifically that the flexible circuit board vertically passes through the connection structure at a center of the connection structure.

In a specific implementation, a length L of the first stiffening plate meets the following: $L > H - 2R$ or $L = H - 2R$, where H is a height of the connection structure, and R is a maximum bendable radius of the flexible circuit board in the connection structure. In this way, the length of the first stiffening plate is disposed, so that the plurality of bending parts can maintain a regular bending structure in the connection structure, and are not easily unfolded.

In a specific implementation, a length L2 of the flexible circuit board may alternatively be set to meet the following: $L2 > L3$, where when $L1 = H - 2R$, L3 is a shortest length of the flexible circuit board that can ensure that the mobile terminal can be bent. In other words, the length of the flexible circuit board increases, so that the plurality of bending parts can maintain a regular bending structure in the connection structure, and are not easily unfolded.

In a specific implementation, the first stiffening plate or the second stiffening plate is adhesively connected to the flexible circuit board.

It can be learned from the foregoing description that the flexible circuit board is bent into a regular bending structure and placed into the connection structure, so that the part of the flexible circuit board maintains a regular bending structure when the connection structure is used, thereby avoiding damage to the flexible circuit board caused by irregular movement, and prolonging a service life of the flexible circuit board.

DESCRIPTION OF EMBODIMENTS

The following clearly describes the technical solutions in the embodiments of the present invention with reference to the accompanying drawings in the embodiments of the present invention. It is clearly that the described embodiments are merely some but not all of the embodiments of the present invention. All other embodiments obtained by a person of ordinary skill in the art based on the embodiments of the present invention without creative efforts shall fall within the protection scope of the present invention.

To resolve a problem that a flexible circuit board is vulnerable to damage, a part of a flexible circuit board of a mobile terminal provided in the embodiments of this application can always maintain a regular bending structure, so as to effectively accommodate a redundancy occurring on the flexible circuit board when the mobile terminal is used, thereby resolving the problem that the flexible circuit board is vulnerable to damage. The following describes the solutions in detail.

An embodiment of this application provides a mobile terminal. The mobile terminal has a sliding structure, a bendable structure, or the like. The sliding structure may be applied to a slide terminal, and the bendable structure may be applied to a notebook computer or a foldable terminal.

Figure 1:
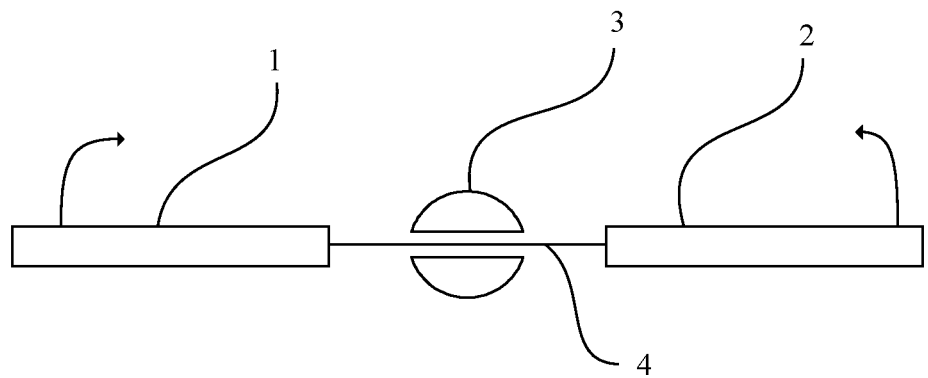
FIG. 1 is a schematic structural diagram when a mobile terminal is unfolded in the prior art.
Figure 2:
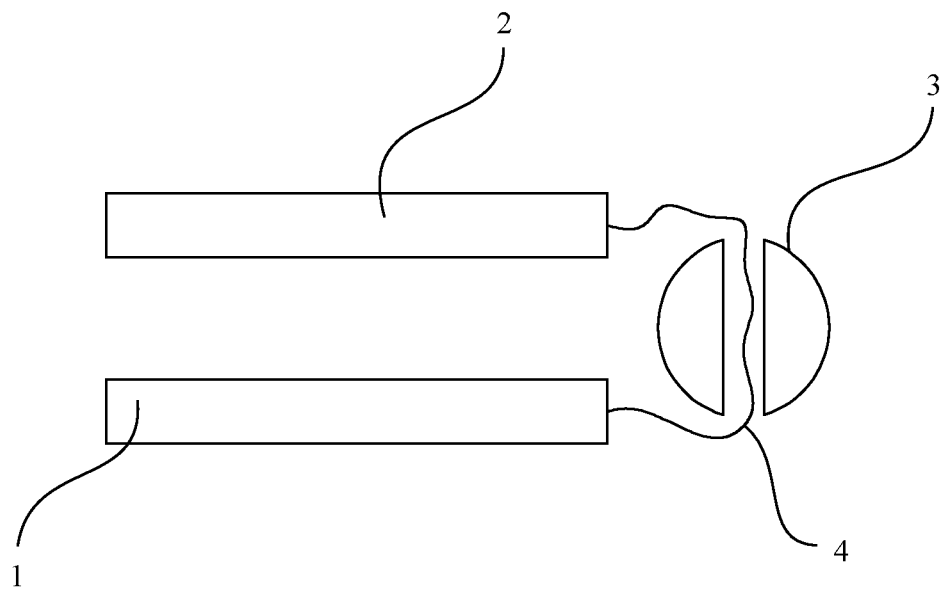
FIG. 2 is a schematic structural diagram when a mobile terminal is bent in the prior art.
Figure 3:
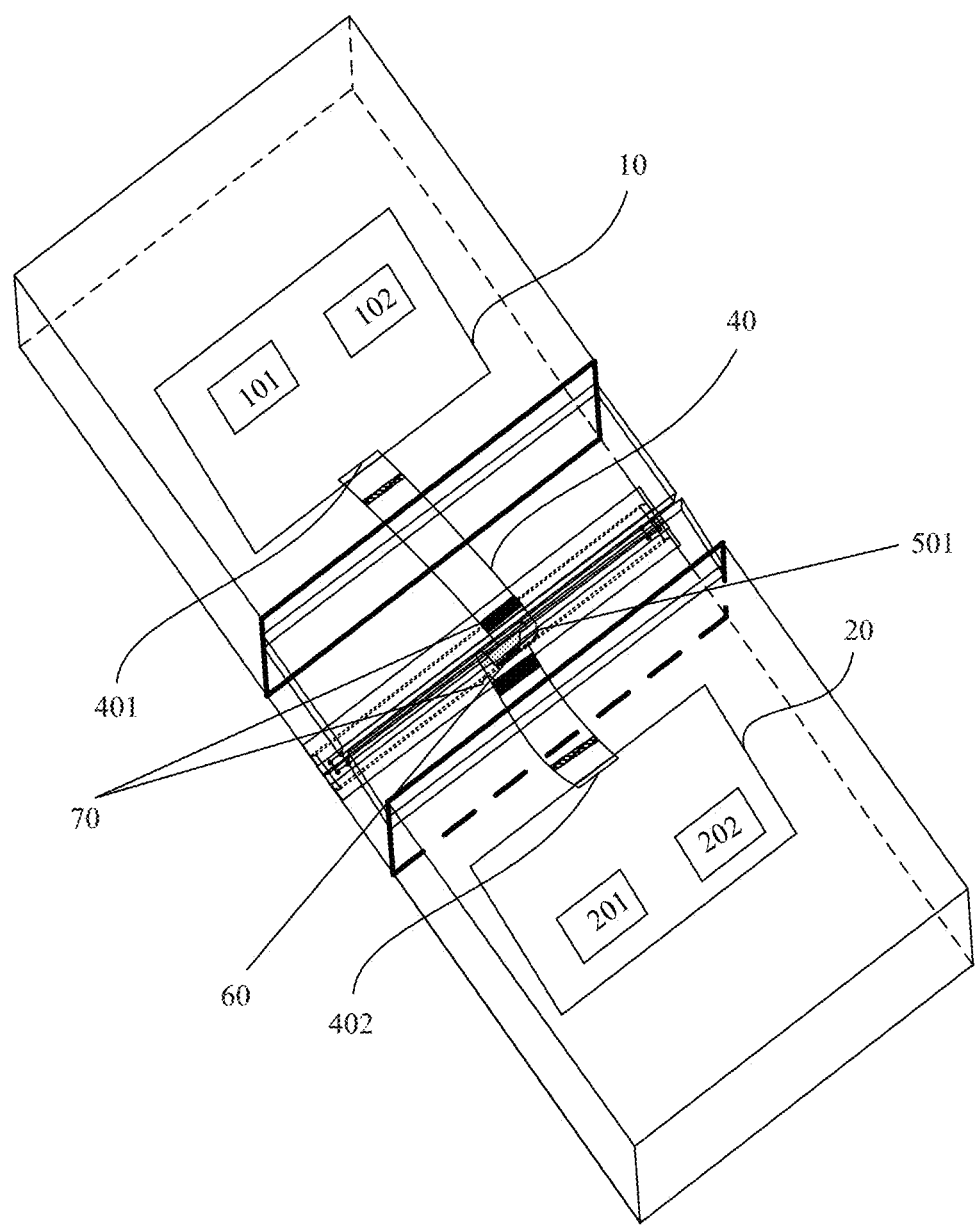
FIG. 3 is a top view of a mobile terminal when the mobile terminal is unfolded according to an embodiment of this application.
Figure 4:
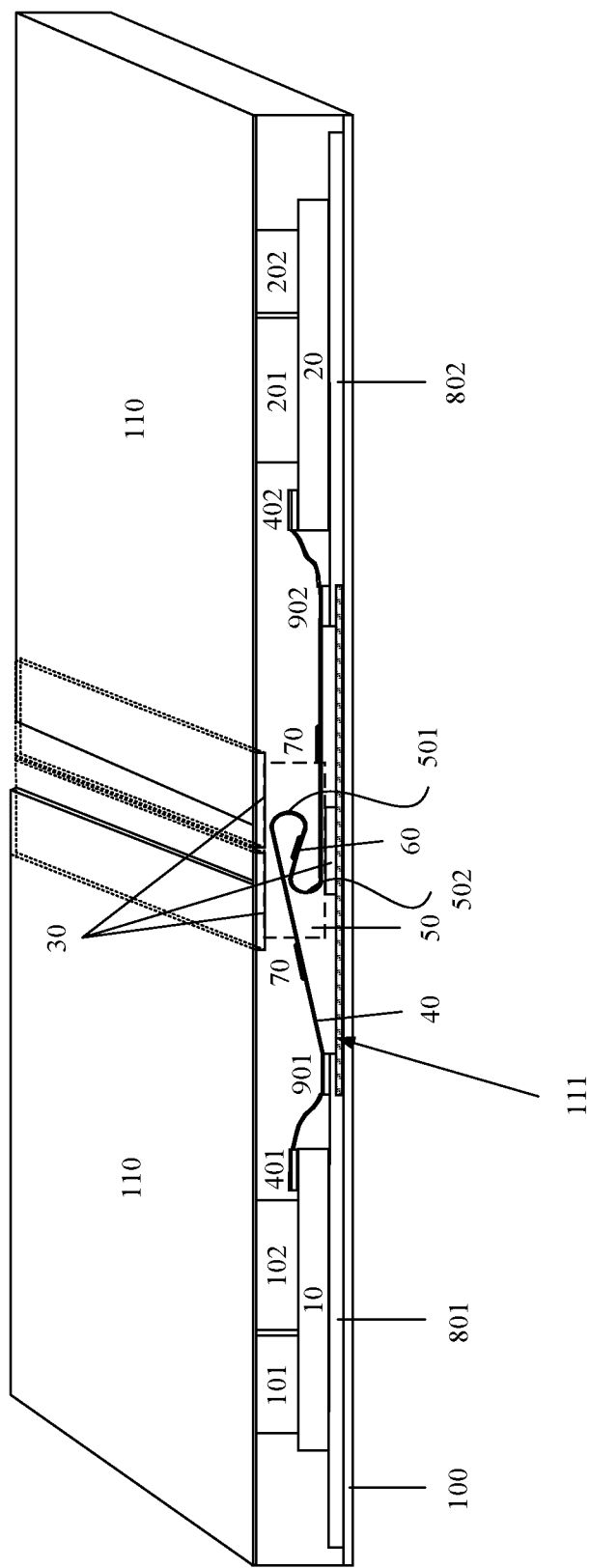
FIG. 4 is a side view of a mobile terminal when the mobile terminal is unfolded according to an embodiment of this application.

FIG. 3 is a top view of a mobile terminal when the mobile terminal is unfolded according to an embodiment of this application. FIG. 4 is a side view of a mobile terminal when the mobile terminal is unfolded according to an embodiment of this application. A connection structure of the mobile terminal includes a sliding structure or a bendable structure. The following describes the embodiments of the present invention with reference to FIG. 3 and FIG. 4 by using the bendable structure as an example. The mobile terminal includes a first part 10, a second part 20, a bendable structure 30, and a flexible circuit board 40. The flexible circuit board 40 includes a first end 401 and a second end 402, the first end 401 is electrically connected to the first part 10, and the second end 402 is electrically connected to the second part 20. A signal is transmitted between the first part 10 and the second part 20 through the flexible circuit board 40. The flexible circuit board 40 passes through the bendable structure 30, and a part of the flexible circuit board 40 in the bendable structure 30 maintains a regular bending structure 50. The bending structure 50 (a part marked by a dashed-line box in the figure) includes a plurality of bending parts, and bending parts 501 and 502 are merely shown as examples in the figure.

It should be noted that, when the mobile terminal is used, a length of the flexible circuit board included in the bending structure 50 continuously changes to accommodate or release a redundant part of the flexible circuit board.

Optionally, a first stiffening plate 60 is disposed between adjacent bending parts. The first stiffening plate increases hardness of the flexible circuit board, so that the part of the flexible circuit board better maintains a regular bending structure when the mobile terminal is used, thereby avoiding damage to the flexible circuit board caused by irregular movement, prolonging a service life of the flexible circuit board, and further prolonging a service life of the entire mobile terminal.

Figure 5A:
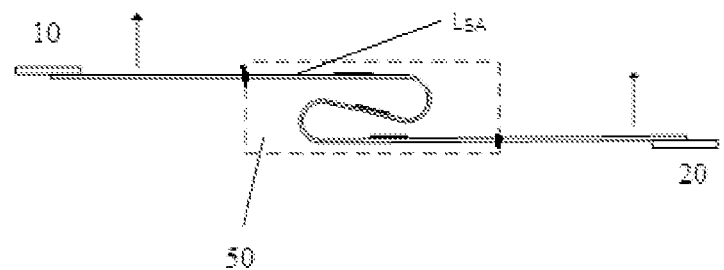
FIG. 5A is a side view of a flexible circuit board of a mobile terminal with a bendable structure in an initial state according to an embodiment of this application.
Figure 5B:
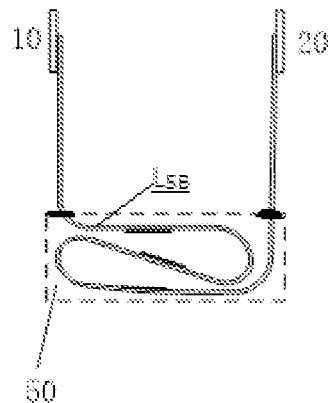
FIG. 5B is a side view of a flexible circuit board after a mobile terminal with a bendable structure rotates according to an embodiment of this application.
Figure 6A:
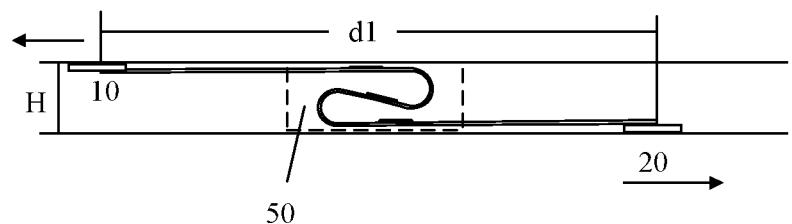
FIG. 6A is a side view of a flexible circuit board of a mobile terminal with a sliding structure in an initial state according to an embodiment of this application.
Figure 6B:
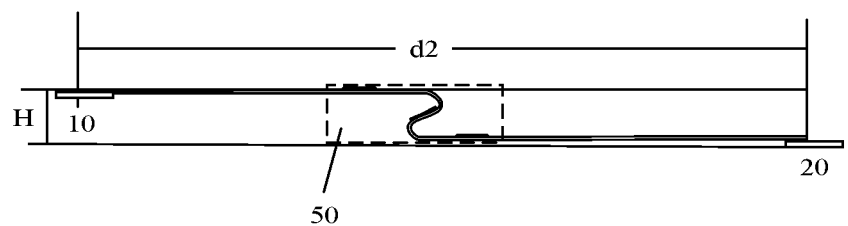
FIG. 6B is a side view of a flexible circuit board after a mobile terminal with a sliding structure slides according to an embodiment of this application.

It should be noted that a manner in which the first part 10 and the second part 20 move varies with a connection structure. FIG. 5A is a side view of a flexible circuit board of a mobile terminal with a bendable structure in an initial state according to an embodiment of this application. FIG. 5B is a side view of a flexible circuit board after a mobile terminal with a bendable structure rotates according to an embodiment of this application. The first part 10 and the second part 20 rotate around the bendable structure 30 in an arrow direction. It can be learned from a comparison between FIG. 5A and FIG. 5B that a radian of a bending part in FIG. 5B is greater than a radian of a bending part in FIG. 5A. To be specific, the radian of the bending part of the flexible circuit board after the first part and the second part rotate is greater than the radian of the bending part in the initial state. This is because the bending structure accommodates the redundant part of the flexible circuit board. FIG. 6A is a side view of a flexible circuit board of a mobile terminal with a sliding structure in an initial state according to an embodiment of this application. A distance between the first part 10 and the second part 20 is d1. FIG. 6B is a side view of a flexible circuit board after a mobile terminal with a sliding structure slides according to an embodiment of this application. The first part 10 and the second part 20 slide oppositely in arrow directions in FIG. 6A, and after the sliding, a distance between the first part 10 and the second part 20 is d2. Herein, d1<d2. In this sliding structure, a radian of a bending part of each of the first part 10 and the second part 20 in an initial state is greater than a radian of a bending part after the first part 10 and the second part 20 slide oppositely. This is because the bending structure in the initial state accommodates the redundant part of the flexible circuit board. In addition, after the first part 10 and the second part 20 slide oppositely, the radian of the bending part decreases to release the redundant part of the flexible circuit board, so that the first part 10 and the second part 20 can slide normally. After the first part 10 and the second part 20 slide oppositely to return to the initial state, the radian of the bending part increases to accommodate the redundant part of the flexible circuit board, so that the flexible circuit board maintains a regular bending structure, thereby effectively protecting the flexible circuit board from being damaged.

In addition, it can be further learned from the comparison between FIG. 5A and FIG. 5B that a length $L_{5A}$ of the flexible circuit board in the bending structure 50 in FIG. 5A is less than a length $L_{5B}$ of the flexible circuit board in the bending structure 50 in FIG. 5B. The bending structure 50 changes from a state in FIG. 5A to a state in FIG. 5B, and a redundant length $L_{5B}$-$L_{5A}$ of the flexible circuit board is accommodated in a change process. It can be further learned from a comparison between FIG. 6A and FIG. 6B that a length $L_{6A}$ of the flexible circuit board in the bending structure 50 in FIG. 6A is greater than a length $L_{6B}$ of the flexible circuit board in the bending structure 50 in FIG. 6B. The bending structure 50 changes from a state in FIG. 6A to a state in FIG. 6B, and a redundant length $L_{6A}$-$L_{6B}$ of the flexible circuit board is released in a change process.

Regardless of the rotating structure or the sliding structure, the bending structure of the flexible circuit board always maintains a regular bending structure. A difference is that the radian of the bending part may change, in other words, the length of the flexible circuit board included in the bending structure may change. The bending structure accommodates the redundant part of the flexible circuit board, thereby effectively avoiding damage to the flexible circuit board caused by irregular movement, prolonging a service life of the flexible circuit board, and further prolonging a service life of the mobile terminal.

Figure 7A:
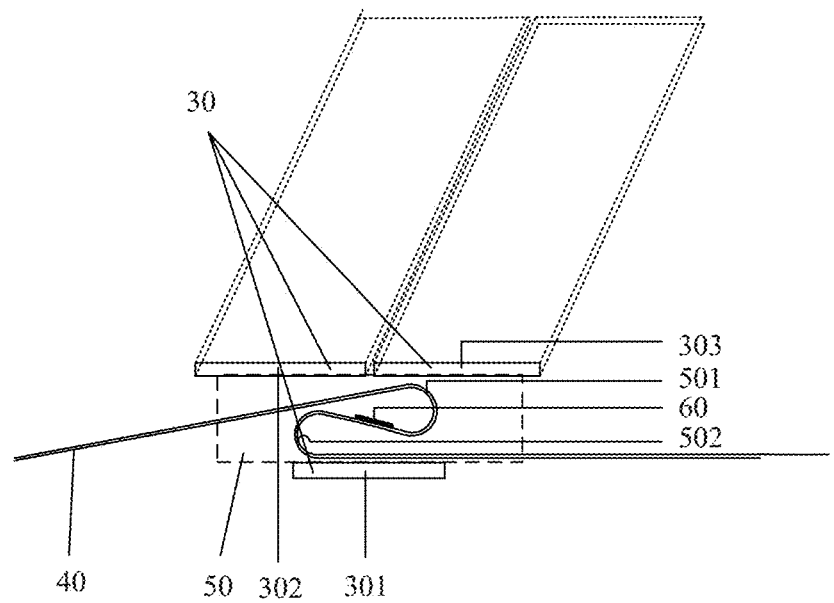
FIG. 7A is a side view of a bendable structure of a mobile terminal according to an embodiment of this application.

FIG. 4 is a side view of a mobile terminal when the mobile terminal is unfolded according to an embodiment of this application. The flexible circuit board 40 is bent into the regular bending structure 50 and then placed into the bendable structure 30. FIG. 7A is a side view of a bendable structure of a mobile terminal according to an embodiment of this application. The bendable structure 30 includes three long-strip-shaped mechanical parts. A first mechanical part 301, and a second mechanical part 302 and a third mechanical part 303 are respectively located on two sides of the bending structure, and the bending structure 50 of the flexible circuit board is controlled in the bendable structure 30. FIG. 7A is merely a schematic diagram of a bendable structure. The bendable structure may alternatively include four long-strip-shaped mechanical parts. Two mechanical parts and the other two mechanical parts are respectively located on two sides of the bending structure, and the bending structure of the flexible circuit board is controlled in the bendable structure. The bendable structure may alternatively be a cylindrical structure. One or more through holes are punched in the cylindrical structure, the flexible circuit board passes through the through hole, and the bending structure of the flexible circuit board is controlled in the bendable structure by using an inner wall of the cylindrical structure.

As shown in FIG. 4, optionally, the bending structure includes a bending part 501 and a bending part 502, and the bending part 501 and the bending part 502 form an S-shaped structure. It should be noted that the S-shaped structure may be a positive S-shaped structure, or may be a reverse S-shaped structure. A specific S-shaped structure to be used is determined when the flexible circuit board of the mobile terminal is installed. This is not specifically limited in the embodiments of the present invention. For example, the flexible circuit board may be bent into a positive S-shaped structure or a reverse S-shaped structure and then placed into the bendable structure.

The bending structure may further include more than two bending parts, for example, three bending parts or four bending parts. FIG. 4 shows only a case in which there are two bending parts. For a case in which there are another quantity of bending parts, refer to the case in which there are two bending parts. For example, three or more bending parts may be included, and the bending structure is in a wave-like shape.

Figure 8:
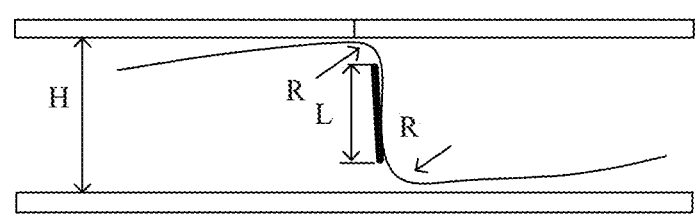
FIG. 8 is a critical state when a bending structure of a mobile terminal is unfolded according to an embodiment of this application.

It should be noted that a first stiffening plate may be disposed between adjacent bending parts. The first stiffening plate is configured to increase strength of the flexible circuit board, so that the flexible circuit board can maintain a regular bending structure, for example, the first stiffening plate 60 in FIG. 4. A length L of the first stiffening plate needs to ensure that adjacent bending parts are not unfolded in the bendable structure. A radius of the bending part needs to be greater than a minimum bendable radius of the flexible circuit board. The minimum bendable radius is a bendable radius meeting a specific reliability requirement, for example, 50,000 times or 100,000 times of dynamic bending, so as to avoid damage to the flexible circuit board 40. The bending part 501 and the bending part 502 shown in FIG. 3 and FIG. 4 are merely examples, and do not represent actual bendable angles of the bending parts. FIG. 8 shows a critical state when a bending structure is unfolded. In this case, the first stiffening plate is approximately parallel to a height direction of the bendable structure, and is bent at two ends of the first stiffening plate. In this case, if the flexible circuit board 40 is further stretched, the bending structure is unfolded. Therefore, to prevent the bending structure from being unfolded, the length L1 of the first stiffening plate meets the following: $L1>H-2R$. Herein, H is a height of the bendable structure, and R is a radius of the bending part. In this way, the plurality of bending parts can maintain a regular bending structure in the bendable structure, and are not easily unfolded. In addition, a length L2 of the flexible circuit board may alternatively be set to meet the following: $L2>L3$. Herein, when $L1=H-2R$, L3 is a shortest length of the flexible circuit board that can ensure that the mobile terminal can be bent. In other words, the length of the flexible circuit board increases to ensure that the flexible circuit board is not unfolded, so that the plurality of bending parts can maintain a regular bending structure in the bendable structure, and are not easily unfolded. For example, when the bending structure is an S-shaped structure, it is ensured that the S-shaped structure is not unfolded.

Optionally, one or more second stiffening plates are disposed between the first end and the bending structure or between the second end and the bending structure, and the second stiffening plate is configured to increase strength of the flexible circuit board. In this way, a part of the flexible circuit board that is between an endpoint of the flexible circuit board and the bending structure can maintain a rectilinear structure, so that the redundant part of the flexible circuit board is smoothly transferred to the bending structure, thereby avoiding damage to the flexible circuit board caused by irregular movement, prolonging a service life of the flexible circuit board, and further prolonging a service life of the entire mobile terminal.

For example, as shown in FIG. 3 and FIG. 4, the mobile terminal includes two second stiffening plates, one second stiffening plate 70 is disposed between the first end 401 and the bending structure 50, and the other second stiffening plate 70 is disposed between the second end 402 and the bending structure 50. The mobile terminal may alternatively include a plurality of second stiffening plates, some are disposed between the first end 401 and the bending structure 50, and the others are disposed between the second end 402 and the bending structure 50. A quantity and a location of second stiffening plates may be determined based on an actual product design requirement. This is not specifically limited in the embodiments of the present invention. In such a manner of symmetrically disposing the second stiffening plates, two sides of the flexible circuit board can move smoothly at the same time, and redundant parts of the flexible circuit board are evenly moved to the two bending parts. Therefore, the bending structure of the flexible circuit board is maintained very well.

It should be noted that the first stiffening plate or the second stiffening plate is made of a rigid material. The rigid material is a polyimide film (Polyimide Film, PI), stainless steel, epoxy resin, Mylar, a protective film, or the like.

Figure 9:
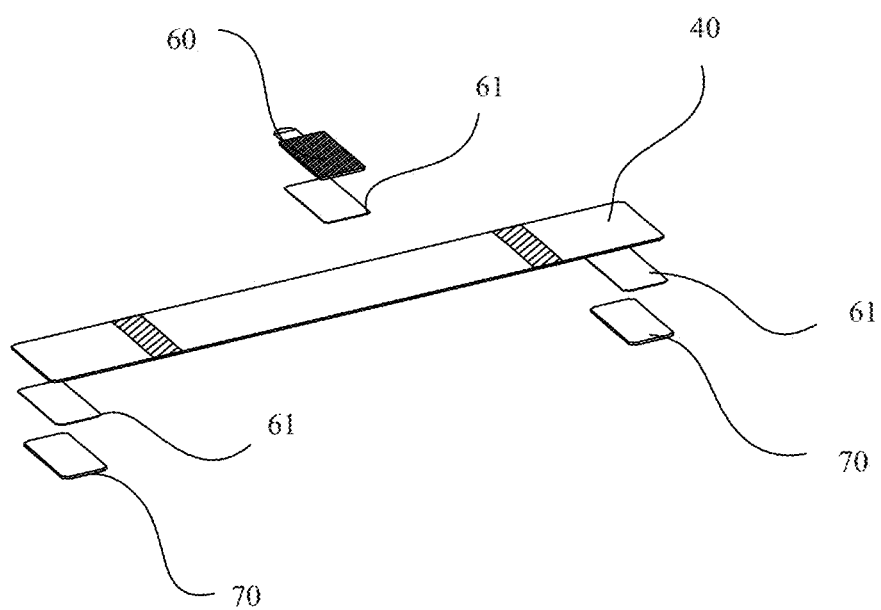
FIG. 9 is a schematic explosion diagram of a flexible circuit board and a stiffening plate according to an embodiment of this application.

FIG. 9 is a schematic explosion diagram of a flexible circuit board and a stiffening plate according to an embodiment of this application. The first stiffening plate 60 is located at a center of the flexible circuit board 40, and is adhesively connected to the flexible circuit board 40 through an adhesive layer 61. The second stiffening plates 70 are on two sides of the flexible circuit board 40, and are adhesively connected to the flexible circuit board 40 through adhesive layers 61. Certainly, the foregoing connection manner is merely a specific connection manner, and another connection manner may be used, for example, a common connection manner such as welding or riveting.

It should be noted that the first stiffening plate 60 and the second stiffening plates 70 may be on a same surface of the flexible circuit board 40, or may be on different surfaces of the flexible circuit board 40. As shown in FIG. 9, the first stiffening plate 60 and the two second stiffening plates 70 are respectively located on two surfaces of the flexible circuit board 40. Certainly, the first stiffening plate 60 and the two second stiffening plates 70 may be on a same surface of the flexible circuit board 40. When the mobile terminal includes more than two second stiffening plates 70, the first stiffening plate 60 and one or more of the second stiffening plates 70 are on a same surface of the flexible circuit board 40, and the first stiffening plate 60 and the other one or more of the second stiffening plates 70 are on different surfaces of the flexible circuit board 40. In other words, the first stiffening plate and the second stiffening plates may be adhered to a same surface or different surfaces of the flexible circuit board, provided that the flexible circuit board can maintain a regular bending structure when the mobile terminal is used.

Optionally, that the flexible circuit board passes through the bendable structure is specifically that the flexible circuit board, perpendicular to a length direction of the bendable structure, passes through the bendable structure at a center of the bendable structure. Certainly, the flexible circuit board may alternatively pass through the bendable structure at any location of the bendable structure. This needs to be set based on an actual requirement, and is not specifically limited in the embodiments of the present invention.

The mobile terminal further includes a middle frame and a fastening part, and the fastening part is located at an end of the flexible circuit board and is fastened to the middle frame. The middle frame and the fastening part may be adhered together by using an adhesive such as double-sided tape or glue. There may be one or more fastening parts. The fastening part may be adhered to the middle frame. Alternatively, the fastening part may not be adhered to the middle frame, for example, may be adhered to a location on the mobile terminal that is opposite to the middle frame, provided that a fastening effect can be achieved. A quantity and a location of fastening parts are not specifically limited in the embodiments of the present invention, and need to be set based on an actual requirement. This is not specifically limited in the embodiments of the present invention.

The flexible circuit board is fastened to the middle frame, so that the flexible circuit board can be limited to moving within a fixed range, thereby more stably controlling the flexible circuit board to maintain a regular bending structure, prolonging a service life of the flexible circuit board, and further prolonging a service life of the mobile terminal.

For example, as shown in FIG. 4, the middle frame includes a first middle frame 801 and a second middle frame 802. The fastening part includes a first fastening part 901 and a second fastening part 902, and the first fastening part 901 and the second fastening part 902 are located on the flexible circuit board 40. The first fastening part 901 is located between the first end 401 and the bending structure 50, the second fastening part 902 is located between the second end 402 and the bending structure 50, the first fastening part 901 is fastened to the first middle frame 801, and the second fastening part 902 is fastened to the second middle frame 802.

Figure 10:
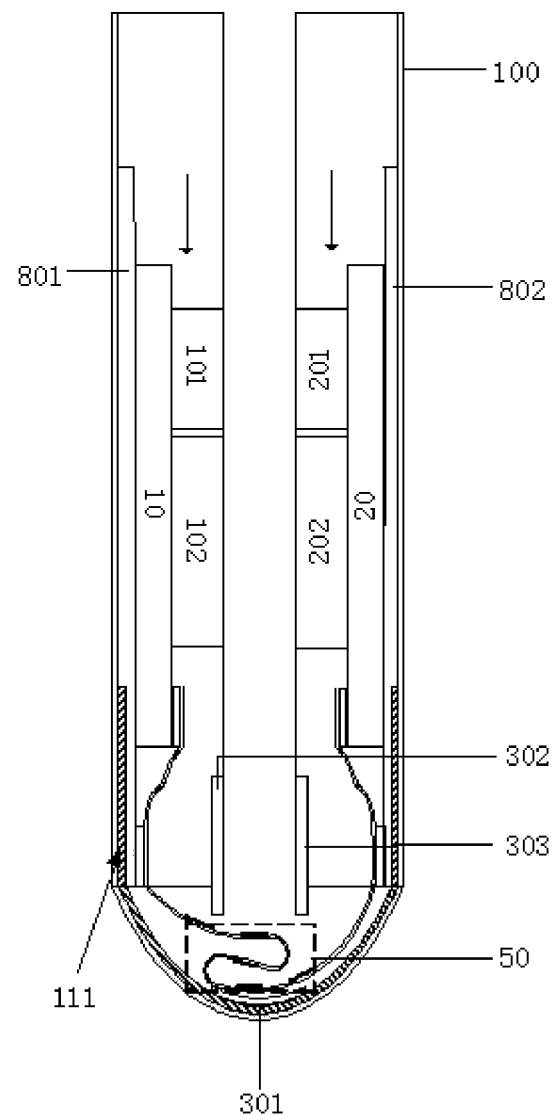
FIG. 10 is a side view of a mobile terminal when the mobile terminal is bent according to an embodiment of this application.

FIG. 10 is a side view of a mobile terminal when the mobile terminal is bent according to an embodiment of this application. When the mobile terminal is bent, the first part 10 and the second part 20 rotate around the bendable structure 30. In this case, the first part 10 moves for a specific distance in a downward arrow direction in FIG. 10 under driving of the first middle frame 801, and the second part 20 moves for a specific distance in a downward arrow direction in FIG. 10 under driving of the second middle frame 802. In a process in which the middle frame moves in the downward arrow direction, the flexible circuit board continuously generates redundancies, and the two bending parts in the bending structure 50 accommodate the redundant parts of the flexible circuit board, so that the flexible circuit board maintains a regular bending structure, thereby effectively prolonging a service life of the flexible circuit board, and further prolonging a service life of the mobile terminal. When the mobile terminal is bent, a first surface of the first part 10 is adjacent to a first surface of the second part 20, a second surface of the first part 10 is opposite to a second surface of the second part 20, the first surface of the first part 10 is opposite to the second surface of the first part 10, and the first surface of the second part 20 is opposite to the second surface of the second part 20.

As shown in FIG. 4, the mobile terminal further includes a screen 100, one or more components (for example, 101, 102, 201, and 202), and a housing 110. The one or more components are located on the first part 10 or the second part 20. The bendable structure 30 is fastened to the housing 110. The screen 100 and the housing 110 form a confined space. The first part 10, the second part 20, the one or more components (101, 102, 201, and 202), the bendable structure 30, the flexible circuit board 40, and the middle frames (801 and 802) are accommodated in the confined space.

It should be noted that the mobile terminal further includes a flexible scalable protective film 111. The flexible scalable protective film 111 is located between the screen 100 and the middle frame, and the flexible scalable protective film III is configured to protect the screen 100 when the mobile terminal is bent. As shown in FIG. 4 and FIG. 10, the flexible scalable protective film 111 covers a part of the middle frame. Certainly, the flexible scalable protective film 111 may alternatively cover the entire middle frame. This is not specifically limited in the embodiments of the present invention.

It should be noted that the first mechanical part 301 in FIG. 10 is bent as the screen is bent, and the screen may be damaged in a bending process. Therefore, the flexible scalable protective film 111 may also be disposed between the screen and the first mechanical part 301.

Figure 7B:
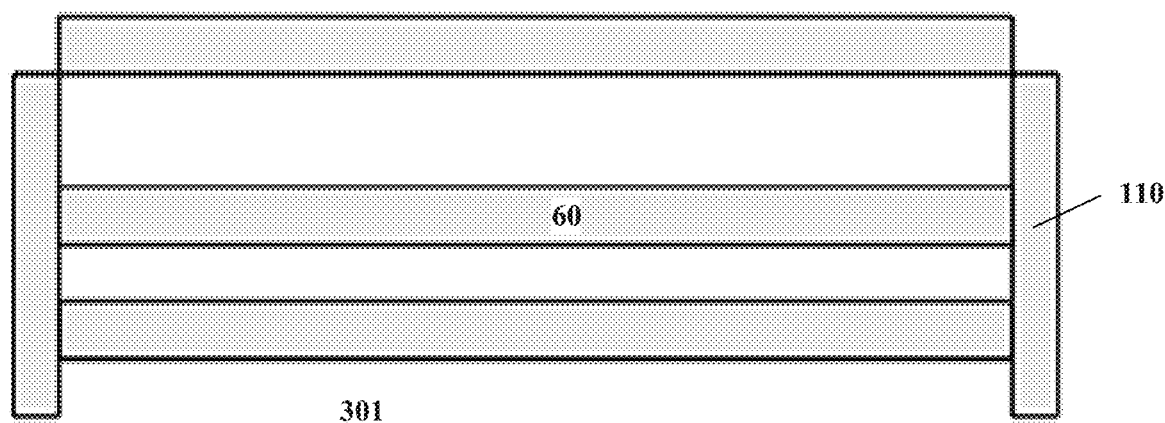
FIG. 7B is a side view of another bendable structure of a mobile terminal according to an embodiment of this application.

It should be noted that the first stiffening plate may be further fastened to the mobile terminal. For example, the first stiffening plate may be disposed in the middle of the mechanical part of the connection structure. FIG. 7B is a side view of another bendable structure of a mobile terminal according to an embodiment of this application. The first stiffening plate 60 is located between the first mechanical part 301 and the second mechanical part 302/the third mechanical part 303, and is fastened to the housing 110. In addition, the first stiffening plate 60 may alternatively be fastened to the middle frame, or the first stiffening plate 60 may be fastened to the bendable structure 30, provided that the first stiffening plate can be fastened. A fastening location of the first stiffening plate 60 is not specifically limited in the embodiments of the present invention. There may be many manners of installing the flexible circuit board in the bendable structure, provided that the two bending parts are respectively located on two sides of the first stiffening plate 60. In this way, the flexible circuit board can be bent into a regular bending structure, and the flexible circuit board can maintain a regular bending structure under a joint effect of the connection structure and the first stiffening plate when the mobile terminal is used, so as to prolong a service life of the flexible circuit board, and further prolong a service life of the entire mobile terminal.

Optionally, the first part and the second part are main boards. One or more components may be disposed on the main board. The component may be a circuit component such as a chip, an inductor, or a capacitor.

Optionally, the mobile terminal is a foldable terminal or a notebook computer. In other words, the technical solutions in this application may be used for the foldable terminal. A state after the foldable terminal is unfolded is shown in FIG. 3 and FIG. 4, and a state after the foldable terminal is bent is shown in FIG. 10.

The technical solutions in this application may also be used for the notebook computer. The first part is a screen of the notebook computer, and the second part is a body of the notebook computer that includes a keyboard. The screen and the body of the notebook computer are connected by using the connection structure in the present invention.

Optionally, the mobile terminal is a slide terminal. The technical solutions of this application may also be used for the slide terminal. For detailed descriptions, refer to the above described solutions.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An apparatus, comprising:
    a first part;
    a second part;
    a bending structure having a fixed size; and
    a flexible circuit board coupled to the first part and the second part and configured to transmit a signal between the first part and the second part, wherein the flexible circuit board comprises:

a first end electrically coupled to the first part;
a second end electrically coupled to the second part; and
two bending parts within the bending structure,
wherein the two bending parts form an S-shaped structure and maintain the S-shaped structure when the apparatus is folded and when the apparatus is unfolded,
wherein the bending structure is configured to contain different lengths of the flexible circuit board, and
wherein a first length of the flexible circuit board in the bending structure when the apparatus is unfolded is less than a second length of the flexible circuit board in the bending structure when the apparatus is folded.

2. The apparatus of claim 1, wherein the apparatus further comprises a first stiffening plate disposed between the two bending parts.

3. The apparatus of claim 2, wherein a length of the first stiffening plate (L) meets one the following conditions:
L>H−2R; or
L=H−2R,
wherein H is a height of the bending structure, and
wherein R is a maximum bendable radius of the flexible circuit board in the bending structure.

4. The apparatus of claim 2, wherein a length of the first stiffening plate (L) meets a condition:
L>H−2R,
wherein H is a height of the bending structure, and
wherein R is a maximum bendable radius of the flexible circuit board in the bending structure.

5. The apparatus of claim 2, wherein a length of the first stiffening plate (L) meets a condition:
L=H−2R,
wherein H is a height of the bending structure, and
wherein R is a maximum bendable radius of the flexible circuit board in the bending structure.

6. The apparatus of claim 2, further comprising a second stiffening plate located on the flexible circuit board, wherein the second stiffening plate is disposed between the first end and the first stiffening plate.

7. The apparatus of claim 2, further comprising a second stiffening plate located on the flexible circuit board, wherein the second stiffening plate is disposed between the second end and the first stiffening plate.

8. The apparatus of claim 2, further comprising a second stiffening plate located on the flexible circuit board, wherein the second stiffening plate is disposed between the first end and the first stiffening plate or between the second end and the first stiffening plate.

9. The apparatus of claim 8, wherein the second stiffening plate comprises two second stiffening plates, wherein one of the two second stiffening plates is disposed between the first end and the first stiffening plate, and wherein the other one of the two second stiffening plates is disposed between the second end and the first stiffening plate.

10. The apparatus of claim 1, further comprising a first stiffening plate, and wherein the first stiffening plate is made of a rigid material.

11. The apparatus of claim 10, wherein the rigid material comprises a polyimide film, stainless steel, epoxy resin, a mylar, or a protective film.

12. The apparatus of claim 10, wherein the rigid material comprises a polyimide film.

13. The apparatus of claim 10, wherein the rigid material comprises a protective film.

14. The apparatus of claim 1, wherein the flexible circuit board is perpendicular to a length direction of the bending structure and passes through the bending structure at a center of the bending structure.

15. The apparatus of claim 1, further comprising a first stiffening plate that is coupled to the flexible circuit board with adhesive.

16. The apparatus of claim 1, further comprising:
a middle frame; and
a fastening part located at an end of the flexible circuit board and fastened to the middle frame.

17. The apparatus of claim 16, wherein the middle frame comprises a first middle frame and a second middle frame, wherein the fastening part comprises a first fastening part and a second fastening part, wherein the first fastening part and the second fastening part are located on the flexible circuit board, wherein the first fastening part is located between the first end and the bending structure, wherein the second fastening part is located between the second end and the bending structure, wherein the first fastening part is fastened to the first middle frame, and wherein the second fastening part is fastened to the second middle frame.

18. The apparatus of claim 16, further comprising:
a screen;
one or more components located on the first part or the second part; and
a housing fastened to the bending structure,
wherein the screen and the housing form a confined space, and
wherein the first part, the second part, the one or more components, the bending structure, the flexible circuit board, and the middle frame are accommodated in the confined space.

19. The apparatus of claim 1, wherein the apparatus is a foldable terminal.

20. The apparatus of claim 1, wherein the apparatus is a notebook computer.

* * * * *